United States Patent
Deguenther et al.

(10) Patent No.: US 9,910,360 B2
(45) Date of Patent: Mar. 6, 2018

(54) LIGHTING SYSTEM OF A MICROLITHOGRAPHIC PROJECTION EXPOSURE SYSTEM AND METHOD FOR OPERATING SUCH A LIGHTING SYSTEM

(71) Applicant: Carl Zeiss SMT GmbH, Oberkochen (DE)

(72) Inventors: Markus Deguenther, Aalen (DE); Vladimir Davydenko, Bad Herrenalb (DE); Thomas Korb, Schwaebisch Gmuend (DE); Johannes Eisenmenger, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/236,725

(22) Filed: Aug. 15, 2016

(65) Prior Publication Data

US 2016/0349624 A1 Dec. 1, 2016

Related U.S. Application Data

(63) Continuation of application No. PCT/EP2015/000273, filed on Feb. 10, 2015.

(30) Foreign Application Priority Data

Feb. 19, 2014 (DE) .................. 10 2014 203 041

(51) Int. Cl.
  *G03B 27/54* (2006.01)
  *G03F 7/20* (2006.01)
(52) U.S. Cl.
  CPC ........ *G03F 7/70058* (2013.01); *G03F 7/7005* (2013.01); *G03F 7/70041* (2013.01); *G03F 7/70075* (2013.01); *G03F 7/70116* (2013.01)

(58) Field of Classification Search
  CPC ................ G03F 7/70291; G03F 7/70558
  USPC ............... 355/53, 67–71; 359/290–292
  See application file for complete search history.

(56) References Cited

U.S. PATENT DOCUMENTS

| | | | |
|---|---|---|---|
| 5,880,817 A | 3/1999 | Hashimoto | |
| 7,061,582 B2 | 6/2006 | Zinn et al. | |
| 2002/0060753 A1* | 5/2002 | Flint | H04N 5/7416 348/744 |
| 2004/0239901 A1* | 12/2004 | Wasserman | G03F 7/70291 355/53 |

(Continued)

FOREIGN PATENT DOCUMENTS

| | | |
|---|---|---|
| EP | 1 262 836 A1 | 12/2002 |
| EP | 2 202 580 A1 | 6/2010 |

(Continued)

OTHER PUBLICATIONS

European patent application No. 13194135.3, entitled "Illumination System of a Microlithgraphic Projection Exposure Apparatus", filed Nov. 22, 2013.

(Continued)

*Primary Examiner* — Hung Henry Nguyen
(74) *Attorney, Agent, or Firm* — Fish & Richardson P.C.

(57) ABSTRACT

An illumination system of a microlithographic projection exposure apparatus includes a light source operated in a pulsed fashion and an array of optical elements which are digitally switchable between two switching positions. The array may be produced using MEMS technology.

15 Claims, 3 Drawing Sheets

(56) References Cited

U.S. PATENT DOCUMENTS

| | | | |
|---|---|---|---|
| 2004/0239907 A1* | 12/2004 | Hintersteiner | G03F 7/70558 355/67 |
| 2004/0239908 A1* | 12/2004 | Bleeker | G03F 7/70283 355/67 |
| 2006/0087634 A1 | 4/2006 | Brown et al. | |
| 2006/0139601 A1* | 6/2006 | Hoogenraad | G03F 7/70258 355/67 |
| 2007/0181834 A1 | 8/2007 | Kleinschmidt | |
| 2008/0304034 A1* | 12/2008 | Ockwell | G03F 7/70291 355/67 |
| 2009/0190197 A1 | 7/2009 | Tinnemans et al. | |
| 2009/0279066 A1 | 11/2009 | Tinnemans et al. | |
| 2010/0060873 A1 | 3/2010 | Deguenther et al. | |
| 2010/0277708 A1 | 11/2010 | Fiolka et al. | |
| 2015/0146184 A1 | 5/2015 | Deguenther et al. | |

FOREIGN PATENT DOCUMENTS

| | | |
|---|---|---|
| WO | WO 2005/026843 A2 | 3/2005 |
| WO | WO 2010/006687 A1 | 1/2010 |
| WO | WO 2012/100791 | 8/2012 |

OTHER PUBLICATIONS

International Search Report, with translation thereof, for corresponding PCT Appl No. PCT/EP2015/000273, dated May 28, 2015.

\* cited by examiner

LIGHTING SYSTEM OF A MICROLITHOGRAPHIC PROJECTION EXPOSURE SYSTEM AND METHOD FOR OPERATING SUCH A LIGHTING SYSTEM

CROSS-REFERENCE TO RELATED APPLICATIONS

The present application is a continuation of, and claims benefit under 35 USC 120 to, international application PCT/EP2015/000273, filed Feb. 10, 2015, which claims benefit under 35 USC 119 of German Application No. 10 2014 203 041.2, filed Feb. 19, 2014. The entire disclosures of international application PCT/EP2015/000273 and German Application No. 10 2014 203 041.2 are incorporated by reference herein.

FIELD

The disclosure relates to an illumination system of a microlithographic projection exposure apparatus, the illumination system including a light source operated in a pulsed fashion and an array—produced e.g. using MEMS technology—of optical elements which are digitally switchable between two switching positions.

BACKGROUND

Integrated electrical circuits and other microstructured components are usually produced by virtue of a plurality of structured layers being applied onto a suitable substrate, which is usually a silicon wafer. For the purposes of structuring the layers, these are initially covered by a photoresist (resist), which is sensitive to light from a specific wavelength range, e.g. light in the deep ultraviolet (DUV), vacuum ultraviolet (VUV) or extreme ultraviolet (EUV) spectral range. Subsequently, the wafer coated thus is exposed in a projection exposure apparatus. Here, a pattern of diffractive structures, which is arranged on a mask, is imaged onto the resist with the aid of a projection lens. Since the absolute value of the imaging scale generally is less than 1 in this case, such projection lenses are sometimes also referred to as reduction lenses.

The wafer is subjected to an etching process after developing the resist, as a result of which the layer is structured in accordance with the pattern on the mask. The resist which still remained is then removed from the remaining parts of the layer. This process is repeated so often until all layers are applied to the wafer.

The prior art has disclosed illumination systems which use mirror arrays in order to be able to variably illuminate the pupil plane of the illumination system. Examples thereof are found in EP 1 262 836 A1, US 2006/0087634 A1, US 2010/0060873 A1, US 2010/0277708 A1, U.S. Pat. No. 7,061,582 B2, WO 2005/026843 A2 and WO 2010/006687 A1. In general, these are mirror arrays in this case, in which the mirrors can be tilted continuously over a certain angle range.

WO 2012/100791 A1 has disclosed an illumination system which additionally includes a digitally switchable micromirror array. This micromirror array is imaged onto the light-entrance facets of an optical integrator with the aid of a lens. A similar, but differently driven illumination system is known from the European patent application filed on Nov. 22, 2013 and having the application number EP 13194135.3, entitled "Illumination System of a Microlithographic Projection Exposure Apparatus", the content of which is incorporated by reference in the subject matter of the present application.

EP 2 202 580 A1 discloses an illumination system including a micromirror array, but the latter is not digitally switchable between two switching positions, but rather is continuously tiltable over a relatively large tilting angle range. The micromirror array is used for setting the illumination setting and is synchronized with the light source such that a change of the illumination setting can take place between two light pulses.

Time division multiplexing operation of two light sources is known from U.S. Pat. No. 5,880,817 and US 2007/0181834 A1.

SUMMARY OF THE DISCLOSURE

The present disclosure seeks to provide an illumination system which contains an array of optical elements which are digitally switchable between two switching positions, and which has particularly stable optical properties.

In one aspect, the disclosure provides an illumination system of a microlithographic projection exposure apparatus including a light source designed for generating a sequence of light pulses. The illumination system furthermore includes an array of optical elements which are digitally switchable between two switching positions. A control device of the illumination system is designed to drive the optical elements such that they change their switching position only between two successive light pulses and maintain their switching position during the light pulses.

The disclosure is based on the insight that the optical elements of the array should be synchronized with the light source such that changes in the switching position take place exclusively in the time intervals between successive light pulses. Since the light pulses are generally short and the switching process likewise extends over a certain time interval, it is difficult to carry out the switching process within a light pulse at a predefined point in time. This would be the prerequisite for obtaining defined relations during the illumination of the mask.

The disclosure takes a different path, by in principle avoiding such switching processes during a light pulse. As a result, the setting of the optical elements to which a specific light pulse is to be assigned is always defined unambiguously.

The control device can be designed to drive the optical elements such that the switching position of at least one of the optical elements is identical during two or more successive light pulses. If the number of light pulses during which the switching position is identical, during the illumination of a mask, is different in the case of different optical elements, it is possible to generate different brightness levels in a manner integrated over time on a target surface illuminated by the array. In this case, the number of light pulses can be made dependent e.g. on measurements or simulations of the intensity on the target surface or in a surface that is optically conjugate with respect thereto.

In one exemplary embodiment, the optical elements move between the switching positions. The control device is designed to drive the optical elements such that the switching position changes $2 \cdot n$, $n=1, 2, 3, \ldots$, times between the two or more successive light pulses. By changing the switching position, the optical elements move, which fosters the movement of the air (or some other gas) surrounding the optical elements and thus the cooling of the optical elements.

The disclosure is not restricted to arrays including micromirrors, since similar problems can also occur in other arrays including digitally switchable optical elements. In this regard, the optical elements can be, for example, tiltable wedge prisms or liquid crystal cells such as are known from LCDs.

A lens can be arranged between the array and a target surface, the lens imaging the array onto the target surface. The target surface can be, in particular, the light entrance facets of an optical integrator that generates a multiplicity of secondary light sources in a pupil plane of the illumination system.

In general, the sequence of the light pulses will be periodic. However, the disclosure is also applicable to such light sources in which the light pulses are not emitted periodically or are not emitted strictly periodically.

The light source can be, in particular, a laser designed for generating projection light and a center wavelength of between 150 nm and 250 nm. In principle, however, the disclosure is also usable for shorter center wavelengths, for instance for center wavelengths in the EUV spectral range.

In one exemplary embodiment, the illumination system includes a further light source, which is designed for generating further light pulses. In this case, the further light pulses are generated in a manner offset temporally with respect to the light pulses of the aforementioned light source. The array is designed to couple, in a first switching position of the optical elements, light pulses of the aforementioned light source and, in a second switching position of the optical elements, light pulses of the further light source into a common beam path of the illumination system. In this way, two light sources can be coupled into the beam path without the input-side etendue of the illumination system increasing as a result. In comparison with conventional switchable coupling-in elements such as tilting mirrors or rotating prisms, an array of digitally switchable optical elements has the advantage that it involves very little structural space and has very short switching times on account of the small masses to be moved. In this way, it is thus possible to double the effective pulse rate of the illumination system and hence the quantity of light available for the exposure of the light-sensitive layer.

The disclosure furthermore relates to a method for operating an illumination system of a microlithographic projection exposure apparatus, including the following steps:
a) providing an array of optical elements which are digitally switchable between two switching positions;
b) generating a sequence of light pulses;
c) changing at least twice the switching position of the optical elements between two successive light pulses.

The optical elements preferably maintain their switching position during the light pulses. The array can be imaged onto a target surface with the aid of a lens.

In one exemplary embodiment, the array couples, in a first switching position of the optical elements, light pulses of the aforementioned light source and, in a second switching position of the optical elements, light pulses of a further light source into a common beam path.

The disclosure additionally relates to an illumination system of a microlithographic projection exposure apparatus including a first light source designed for generating a sequence of first light pulses, and including a second light source designed for generating a sequence of second light pulses, which are emitted in a manner offset temporally with respect to the first light pulses. A control device is designed to drive an array of optical elements which are digitally switchable between two switching positions such that, in a first switching position of the optical elements, exclusively light pulses of the aforementioned light source and, in a second switching position of the optical elements, exclusively light pulses of the further light source are coupled into a common beam path of the illumination system.

The disclosure furthermore relates to a method for operating an illumination system of a microlithographic projection exposure apparatus including the following steps:
a) generating a sequence of first light pulses by means of a first light source;
b) generating a sequence of second light pulses by means of a second light source, which are offset temporally with respect to the first light pulses;
c) driving an array of optical elements which are digitally switchable between two switching positions in such a way that, in a first switching position of the optical elements, exclusively light pulses of the aforementioned light source and, in a second switching position of the optical elements, exclusively light pulses of the further light source are coupled into a common beam path of the illumination system.

BRIEF DESCRIPTION OF THE DRAWINGS

Further features and advantages of the disclosure will become apparent from the following description of exemplary embodiments with reference to the drawings, in which.

DESCRIPTION OF PREFERRED EXEMPLARY EMBODIMENTS

Figure 1:
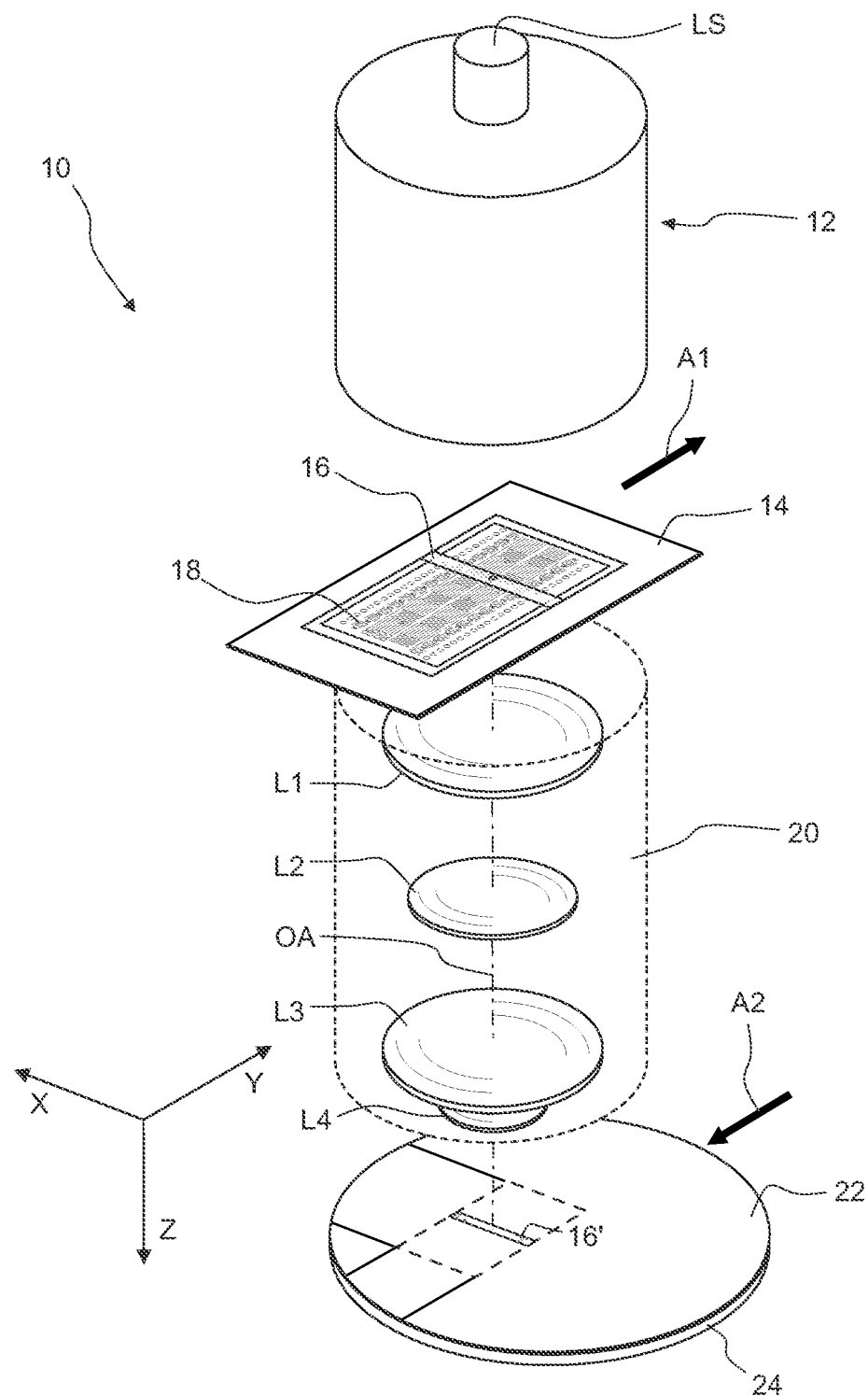
FIG. 1 shows a much simplified perspective illustration of a microlithographic projection exposure apparatus.

FIG. 1 shows a projection exposure apparatus 10 in a very schematic perspective illustration, the projection exposure apparatus being suitable for the lithographic production of microstructured components. The projection exposure apparatus 10 contains an illumination system 12 including a light source LS, designed for generating projection light having a center wavelength of 193 nm. The illumination system 12 directs the projection light generated by the light source LS onto a mask 14 and illuminates there a narrow illumination field 16, which is rectangular in the exemplary embodiment illustrated. Other illumination field forms, e.g. ring segments, likewise come into consideration.

Structures 18 on the mask 14 lying within the illumination field 16 are imaged on a light-sensitive layer 22 with the aid of a projection lens 20, which contains a plurality of lens elements L1 to L4. The light-sensitive layer 22, which may be e.g. a resist, is applied to a wafer 24 or another suitable substrate and is situated in the image plane of the projection lens 20. Since the projection lens 20 generally has an imaging scale $|\beta|<1$, the structures 18 lying within the illumination field 16 are imaged with reduced size on a projection field 18'.

In the depicted projection exposure apparatus 10, the mask 14 and the wafer 24 are displaced along a direction denoted by Y during the projection. The ratio of the displacement speeds in this case equals the imaging scale β of the projection lens 20. If the projection lens 20 inverts the image (i.e. β<0), the displacement movements of the mask 14 and of the wafer 24 extend counter to one another, as indicated in FIG. 1 by arrows A1 and A2. In this manner, the illumination field 16 is guided in a scanning movement over the mask 14 such that even relatively large structured regions can be projected contiguously on the light-sensitive layer 22.

Figure 2:
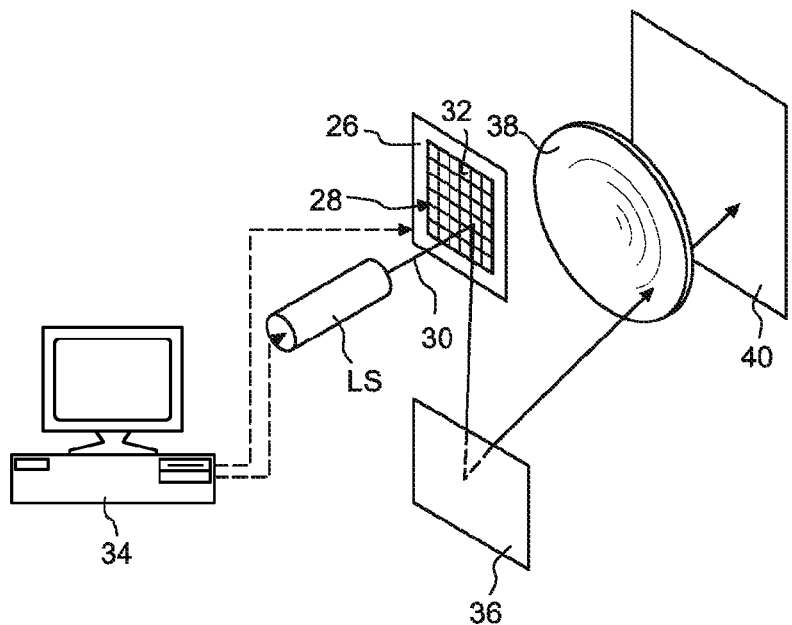
FIG. 2 shows parts of an illumination system according to the disclosure in a schematic perspective illustration.

FIG. 2 shows parts of the illumination system 12 according to the disclosure schematically in a perspective illustration. The illumination system 12 includes a carrier 26 for a micromirror array 28, onto which the light source LS directs projection light 30 directly or via further optical elements (not illustrated). The micromirror array 28, which can be realized as a DMD (digital mirror device), contains a regular arrangement of micromirrors 32 which are digitally switchable in each case between two switching positions. For this purpose, the micromirror array 28 is connected to a control device 34 via a signal connection indicated in a dashed manner. Projection light 30 incident on the micromirror array 28, after deflection via a plane folding mirror 36, is directed via a lens 38 onto a target surface 40, which may be for example the surface of an optical integrator. In this case, the lens 38 has the effect that the micromirror array 28 is imaged onto the target surface 40. In this way, the target surface 40 can be illuminated variably with the aid of the micromirror array 28.

Figure 3:
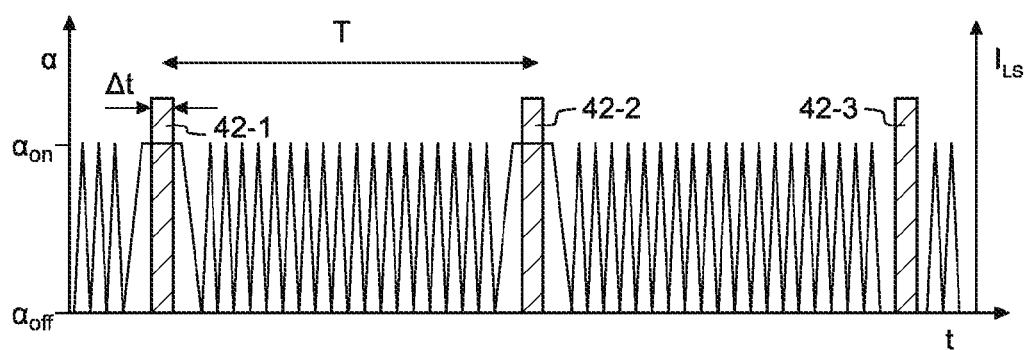
FIG. 3 shows a graph in which the angular position of a micromirror is plotted as a function of the light pulses over time.

FIG. 3 shows a graph in which the intensity of the projection light 30 generated by the light source LS (right-hand ordinate) and the angular position of one of the micromirrors 32 (left-hand ordinate) are plotted against time t. In this exemplary embodiment, it is assumed that the light source LS generates light pulses 4-21 to 42-3 having the duration $\Delta t$ and having a period T, wherein $\Delta t/T \ll 1$. Consequently, a relatively long time in which no projection light passes through the illumination system 12 elapses between two successive light pulses 42. The pulse frequency of the light source LS is typically of the order of magnitude of a few kHz.

In the graph in FIG. 3 it can be discerned that the relatively long time interval between successive light pulses 42 is used to switch the relevant micromirror 32 multiply between its two switching positions, angles $\alpha_{on}$ and $\alpha_{off}$ respectively corresponding to the switching positions. During the light pulses 42, however, the relevant micromirror 32 is always situated in a defined switching position, namely—during the first two light pulses 42-1 and 42-2—in a switching position in which light is directed onto the target surface 40 ($\alpha=\alpha_{on}$) and—during the third light pulse 42-3—in a second switching position, in which no light is directed onto the target surface 40 ($\alpha=\alpha_{off}$).

Multiply changing the switching position between successive light pulses 42-1 to 42-3 fosters the movement of the air (or some other gas) surrounding the micromirrors 32 and thus the cooling of the micromirrors 32. There is generally a desire for cooling because an (albeit a small) part of the high-energy projection light 30 incident on the micromirrors 32 is absorbed by the reflective coating of the micromirrors 32 and converted into heat. Cooling across micromirrors 32 solely via the carrier 26 may therefore not suffice for the cooling. Cooling by convection is particularly effective if the surrounding air is moved by the micromirrors 32 changing their switching position.

Figure 4:
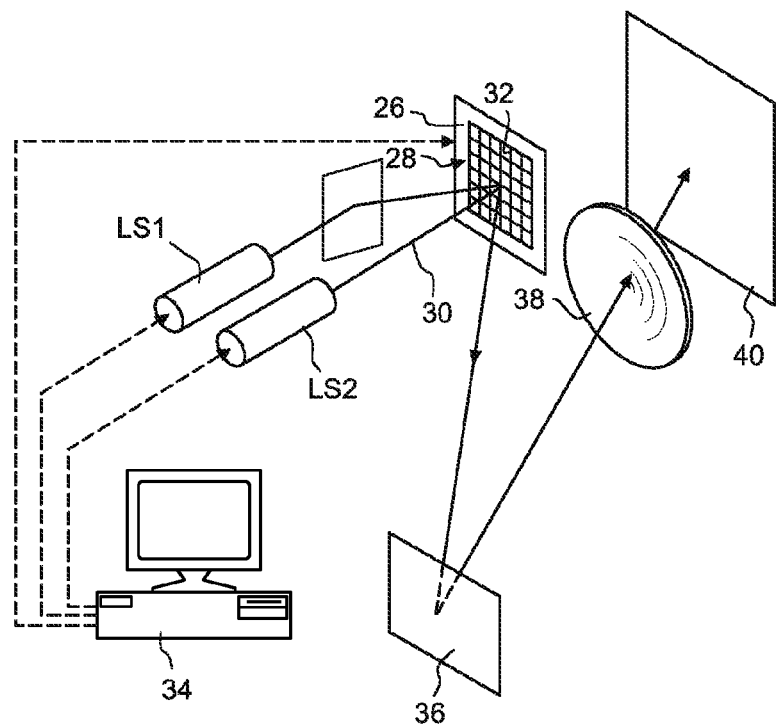
FIG. 4 shows parts of an illumination system according to the disclosure in accordance with another exemplary embodiment in an illustration based on FIG. 2.

FIG. 4 shows, in an illustration based on FIG. 2, another exemplary embodiment wherein the micromirror array 28 is used to interlace first light pulses, which are generated by a first light source LS1 and second light pulses, which are generated by a second light source LS2, in the manner of time division multiplexing such that downstream of the micromirror array 28 the projection light 30 with double the pulse frequency is directed onto the downstream optical elements of the illumination system 12.

For this purpose, the control unit 34 drives the micromirror array 28 such that, in a first switching position, the micromirrors 32 couple exclusively the first light pulses of the first light source LS1 and, in a second switching position of the micromirrors 32, couple exclusively the second light pulses of the second light source LS2 into a common beam path of the illumination system.

At the folding mirror 36, therefore, the first and second light pulses are incident exactly from the same direction, but with a pulse frequency that is doubled in comparison with the pulse frequency of each individual light source LS1, LS2.

Figure 5:
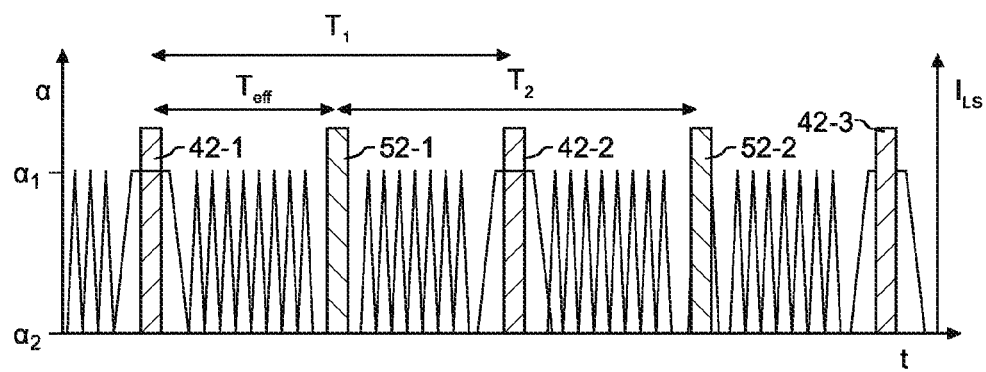
FIG. 5 shows a graph corresponding to FIG. 3 for the exemplary embodiment shown in FIG. 4.

This is illustrated by the graph shown in FIG. 5. The periodic sequences of the first and second light pulses 42-1, 42-2 and 52-1, 52-2 are identified by different etchings. The interlacing of the first light pulses emitted with the period T1 and the second light pulses emitted with the period T2=T1 yields a sequence of light pulses having an effective period $T_{eff}=T1/2=T2/2$. The control device 34 drives the relevant micromirror 32 such that it is situated in its first switching position, which corresponds to the angle $a_1$, during the first light pulses 42-1, 42-2, 42-3. During the second light pulses 52-1, 52-2, the micromirror is situated in its second switching position, which corresponds to the tilting angle $a_2$.

In this exemplary embodiment, too, the micromirror 32 is switched between its two switching positions multiply between two successive light pulses 42-1, 42-2, 42-3, 52-1, 52-2 originating from different light sources LS1, LS2, in order to improve the cooling by the surrounding air.

What is claimed is:

1. An illumination system configured to illuminate a mask during use of the illumination system, the illumination system comprising:
   an array of optical elements which are digitally switchable between two switching positions;
   a control device configured to drive the optical elements so that during use of the illumination system the switching position of the optical elements: a) changes between two successive pulses of light generated by a light source; and b) is unchanged when the light source generates light pulses;
   a lens in a path of the light pulses generated by the light source between the array and a target surface that is upstream of the mask,
   wherein:
      the lens is configured to image the array onto the target surface during use of the illumination system; and
      the illumination system is a microlithography illumination system.

2. The illumination system of claim 1, further comprising the light source configured to generate the pulses of light.

3. The illumination system of claim 1, wherein the control device is configured to drive the optical elements so that during use of the illumination system the switching position of at least one optical element is identical during two or more successive pulses of light generated by the light source.

4. The illumination system of claim 3, wherein:
   the control device is configured to drive the optical elements so that during use of the optical system the switching position changes 2·n times between the two or more successive pulses of light generated by the light source; and n is an integer having a value of at least one.

5. The illumination system of claim 1, wherein the control device is configured to drive the optical elements so that during use of the illumination system:
the switching position of a first optical element is identical during a first number of successive pulses of light generated by the light source;
the switching position of a first optical element is identical during a second number of successive pulses of light generated by the light source;
the first number of successive pulses is greater than one;
the second number of successive pulses is greater than one; and
the first number is different from the second number.

6. The illumination system of claim 5, wherein the control device is configured to drive the optical elements so that during use of the optical system the switching position changes 2·n times between the two or more successive pulses of light generated by the light source, and n is an integer having a value of at least one.

7. The illumination system of claim 1, wherein:
a first light source which is the light source configured to generate the pulses of light;
the illumination system comprises a second light source configured to generate further pulses of light that are offset temporally with respect to the pulses of light generated by the first light source;
in a first switching position of the optical elements, the array couples light pulses generated by the first light source into a common beam path of the illumination system; and
in a second switching position of the optical elements, the array couples light pulses generated by the second light source into the common beam path of the illumination system.

8. An apparatus, comprising:
an illumination system according to claim 1; and
a projection lens configured to image the mask into an image field of the projection lens,
wherein the apparatus is a microlithographic projection exposure apparatus.

9. A method of operating a microlithographic projection exposure apparatus comprising an illumination system and a projection lens, the method comprising:
using the illumination system to illuminate a pattern of a mask; and
using the projection lens to image at least some of the illuminated pattern of the mask onto a light sensitive material located in an image field of the projection lens,
wherein the illumination system is an illumination system according to claim 1.

10. A method for operating a system which comprises a projection lens and an illumination system, the illumination system comprising an array of optical elements which are digitally switchable between two switching positions, the method comprising:
using the illumination system to illuminate a pattern of a mask;
imaging the array of optical elements onto a target surface that is arranged upstream of the mask; and
using the projection lens to image at least some of the illuminated pattern of the mask onto a light sensitive material,
wherein the method comprises changing the switching position of the optical elements only between two successive pulses of light generated by a light source.

11. The method of claim 10, wherein the switching position of at least one of the optical elements is identical during two or more successive pulses of light.

12. The method of claim 11, wherein the number of light pulses during which the switching position is identical, during the illumination of the mask, is different for different optical elements.

13. The method of claim 12, wherein the switching position changes 2·n times between the two or more successive light pulses, and n is an integer having a value of at least one.

14. The method of claim 11, wherein the switching position changes 2·n times between the two or more successive light pulses, and n is an integer having a value of at least one.

15. The method of claim 10, wherein:
a first light source generates the pulses of light;
a second light source generates further pulses of light that are offset temporally with respect to the pulses of light generated by the first light source;
in a first switching position of the optical elements, the array couples light pulses generated by the first light source into a common beam path of the illumination system; and
in a second switching position of the optical elements, the array couples light pulses generated by the second light source into the common beam path of the illumination system.

* * * * *

UNITED STATES PATENT AND TRADEMARK OFFICE
CERTIFICATE OF CORRECTION

PATENT NO. : 9,910,360 B2
APPLICATION NO. : 15/236725
DATED : March 6, 2018
INVENTOR(S) : Markus Deguenther et al.

It is certified that error appears in the above-identified patent and that said Letters Patent is hereby corrected as shown below:

In the Specification

Column 2, Line 36: Delete "exelusively" and insert -- exclusively --, therefor

Signed and Sealed this
Twenty-ninth Day of May, 2018

Andrei Iancu
*Director of the United States Patent and Trademark Office*